United States Patent

Sasamoto

(10) Patent No.: US 12,288,688 B2
(45) Date of Patent: Apr. 29, 2025

(54) MANUFACTURING METHOD OF PHOTOMASK, AND PHOTOMASK BLANK

(71) Applicant: Shin-Etsu Chemical Co., Ltd., Tokyo (JP)

(72) Inventor: Kouhei Sasamoto, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 325 days.

(21) Appl. No.: 17/354,201

(22) Filed: Jun. 22, 2021

(65) Prior Publication Data

US 2021/0407803 A1    Dec. 30, 2021

(30) Foreign Application Priority Data

Jun. 30, 2020  (JP) .................................. 2020-112639

(51) Int. Cl.
  *G03F 1/32* (2012.01)
  *H01L 21/033* (2006.01)

(52) U.S. Cl.
  CPC ............ *H01L 21/0337* (2013.01); *G03F 1/32* (2013.01); *H01L 21/0332* (2013.01)

(58) Field of Classification Search
  CPC ........................................................ G03F 1/26
  See application file for complete search history.

(56) References Cited

U.S. PATENT DOCUMENTS

| | | |
|---|---|---|
| 2006/0057469 A1 | 3/2006 | Kureishi et al. |
| 2012/0082924 A1* | 4/2012 | Kominato ................ G03F 1/00 430/5 |
| 2015/0198873 A1* | 7/2015 | Okubo ...................... G03F 1/80 430/5 |
| 2017/0023856 A1 | 1/2017 | Okubo et al. |
| 2017/0068156 A1* | 3/2017 | Sasamoto ................ G03F 1/80 |
| 2018/0088457 A1* | 3/2018 | Inazuki ................... G03F 1/26 |
| 2018/0224737 A1* | 8/2018 | Inazuki ................... C01B 33/06 |
| 2018/0259843 A1* | 9/2018 | Fukaya ................... G03F 1/26 |
| 2018/0335691 A1* | 11/2018 | Nam ......................... G03F 1/26 |
| 2019/0204728 A1 | 7/2019 | Shishido |
| 2019/0369482 A1* | 12/2019 | Inazuki ............... H01L 21/0337 |
| 2020/0379337 A1* | 12/2020 | Shin ......................... G03F 1/32 |

FOREIGN PATENT DOCUMENTS

| | | |
|---|---|---|
| JP | 63-85553 A | 4/1988 |
| JP | 6-301195 A | 10/1994 |
| JP | 7-49558 A | 2/1995 |
| KR | 10-2011-0037890 A | 4/2011 |

OTHER PUBLICATIONS

Extended European Search Report for corresponding European Application No. 21182583.1, dated Dec. 9, 2021.

* cited by examiner

*Primary Examiner* — Erik Kielin
(74) *Attorney, Agent, or Firm* — Birch, Stewart, Kolasch & Birch, LLP

(57) ABSTRACT

A photomask is manufactured from a photomask blank including a transparent substrate, a first inorganic film which comprises silicon and is free of chromium, and a second inorganic film which comprises chromium and is free of silicon, and is in contact with the first inorganic film by a method including steps of forming a pattern of the second inorganic film by fluorine-based dry etching with using a resist pattern, and forming a pattern of the first inorganic film by fluorine-based dry etching with using the pattern of the second inorganic film.

9 Claims, 6 Drawing Sheets

MANUFACTURING METHOD OF PHOTOMASK, AND PHOTOMASK BLANK

CROSS-REFERENCE TO RELATED APPLICATION

This non-provisional application claims priority under 35 U.S.C. § 119(a) on Patent Application No. 2020-112639 filed in Japan on Jun. 30, 2020, the entire contents of which are hereby incorporated by reference.

TECHNICAL FIELD

This invention relates to a method for manufacturing a photomask which is used in manufacturing semiconductor integrated circuits, and a suitable photomask blank for the is method.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing inter-layer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. In the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Then, at the present, the lithography technology for obtaining photomask patterns also requires a higher accuracy processing method.

In forming a photomask pattern, usually, a resist film is formed on a photomask blank including a light-shielding film, a phase shift film, or the like on a transparent substrate, the pattern is drawn by an electron beam, and a resist pattern is developed. The obtained resist pattern is used as an etching mask, and the light-shielding film, the phase-shift film, or the like is etched to form a light-shielding film pattern or a phase-shift film pattern (photomask pattern). However, if a finer photomask pattern is processed with not changing and maintaining the thickness of the resist film, a ratio of the film thickness to a pattern width, so-called an aspect ratio, becomes high, and the shape of the resist pattern deteriorates. Consequently, the pattern transfer results in failure, and in some cases, the resist pattern may collapse or peel off. Therefore, it is necessary to thin the resist film in accordance with fining the photomask pattern.

On the other hand, a method of using a hard mask in order to reduce load on a resist pattern during dry etching has been tried for a long time. For example, JP-A S63-85553 (Patent Document 1) discloses that a $SiO_2$ film is formed on a $MoSi_2$ film, and a pattern of the $SiO_2$ film is used as an etching mask when the $MoSi_2$ film is dry-etched using a gas containing chlorine. Further, JP-A H7-49558 (Patent Document 2) discloses that a chromium film is formed as a light-shielding film on a phase shift film, a $SiO_2$ film is formed as a hard mask film on the chromium film, and a pattern of the $SiO_2$ film is used as a hard mask when the chrome film is etched.

CITATION LIST

Patent Document 1: JP-A S63-85553
Patent Document 1: JP-A H7-49558

SUMMARY OF THE INVENTION

As the photomask pattern becomes finer, adhesion of a resist film and a resist pattern becomes important. When a film containing silicon is processed by using a resist pattern, as an etching mask, that has been processed from a resist film formed on the film containing silicon, since adhesion between the film containing silicon and the resist film is low. Therefore, if a fine photomask pattern is tried to form, there is a problem that the resist is peeled off in the developing process for forming the resist pattern from the resist film. In order to avoid this problem, it is known that silylation treatment in which hexamethyldisilazane or the like is applied to the surface of the film containing silicon is effective.

However, when the silylation treatment is applied, the hydrophobicity of the surface to be treated becomes high, and difficult to water-based cleaning. Therefore, there is a problem that a large amount of resist residues remains in the cleaning step after development when the resist pattern is formed from the resist film, resulting in defects. On the other hand, as a means for improving adhesion of the resist film and the film containing silicon by controlling the film containing silicon, for example, a composition of the surface of the film containing silicon such as a $SiO_2$ film may be adjusted to a composition having good adhesion to the resist film. However, when trying to improve the adhesion of the resist film without impairing optical properties and etching properties that are essential properties required for the film containing silicon, the means by changing the composition of the film containing silicon has low degree-of-freedom. Further, if the composition of the surface of the film containing silicon is adjusted in consideration of adhesion to the resist film, there is a problem that controllability of etching is deteriorated, and it is hard to impart conductivity.

The present invention has been made to solve the above problems, and an object of the present invention is to provide a method in which a photomask is manufactured without degrading properties required for a silicon-containing film provided in a photomask blank and a photomask, and with avoiding the problem of adhesion between the silicon-containing film and the resist film (collapse or peeling of the resist pattern) that occurs when the resist film is formed on the silicon-containing film, and further with suppressing generation of defects due to resist residues during cleaning. Another object of the present invention is to provide a suitable photomask blank for the method.

The inventor founds that when a photomask is manufactured from a photomask blank including a transparent substrate, and a first inorganic film which contains silicon and is free of chromium, adhesion of a resist film can be ensured by forming a second inorganic film which contains chromium and is free of silicon, and is in contact with the first inorganic film. Further, the inventor founds that, when the second inorganic film which contains chromium and is free of silicon is a film that can be etched by fluorine-based dry etching, particular, a film that has a ratio of an etching rate of the second inorganic film to an etching rate of the first inorganic film of not less than 0.3 by fluorine-based dry under the same condition, a fine photomask pattern with high accuracy can be formed with avoiding generation of resist residues, which is a problem in the silylation treatment of silicon-containing film, by forming a resist film in contact with the second film, forming a resist pattern from the resist film, and patterning the second inorganic film and the first inorganic film by fluorine-based dry etching in this order.

In one aspect, the invention provides a method for manufacturing a photomask from a photomask blank including a transparent substrate, a first inorganic film which contains silicon and is free of chromium, and a second inorganic film which contains chromium and is free of silicon, the first inorganic film and the second inorganic film being contacted, the first inorganic film being formed on the transparent substrate directly or via one or more another inorganic films, wherein the method including the steps of:
(A) forming a resist film in contact with the second inorganic film;
(B) patterning the resist film to form a resist pattern;
(C) forming a pattern of the second inorganic film by etching the second inorganic film by fluorine-based dry etching with using the resist pattern as an etching mask; and
(D) forming a pattern of the first inorganic film by etching the first inorganic film by fluorine-based dry etching with using the pattern of the second inorganic film as an etching mask.

In another aspect, the invention provides a method for manufacturing a photomask from a photomask blank including a transparent substrate, a first inorganic film which contains silicon and is free of chromium, a second inorganic film which contains chromium and is free of silicon, and a resist film, the first inorganic film, the second inorganic film and the resist film being contacted in this order, the first inorganic film being formed on the transparent substrate directly or via one or more another inorganic films, wherein the method including the steps of:
(B) patterning the resist film to form a resist pattern;
(C) forming a pattern of the second inorganic film by etching the second inorganic film by fluorine-based dry etching with using the resist pattern as an etching mask; and
(D) forming a pattern of the first inorganic film by etching the first inorganic film by fluorine-based dry etching with using the pattern of the second inorganic film as an etching mask.

Preferably, steps (C) and (D) are continuously performed by the fluorine-based dry etching.

Preferably, the fluorine-based dry etching in step (C) and the fluorine-based dry etching in step (D) are performed under the same condition, and a ratio of an etching rate of the second inorganic film by the fluorine-based dry etching applied in step (C) to an etching rate of the first inorganic film by the fluorine-based dry etching applied in step (D) is not less than 0.3.

Preferably, the second inorganic film has a chromium content of not less than 25 at % and not more than 40 at %.

Preferably, the second inorganic film has a thickness of not less than 1 nm and not more than 10 nm.

Preferably, in the method, the photomask blank includes a third inorganic film which comprises chromium and is free of silicon, as said other film, and the third inorganic film is in contact with the transparent substrate side of the first inorganic film.

Preferably, a ratio of an etching rate of the third inorganic film by the fluorine-based dry etching applied in step (D) to an etching rate of the first inorganic film by the fluorine-based dry etching applied in step (D) is less than 0.3.

Preferably, in the method, the photomask blank includes a fourth inorganic film which comprises silicon and is free of chromium, as said other film, and the fourth inorganic film is in contact with the transparent substrate side of the third inorganic film.

Preferably, the first inorganic film is a hard mask film for the third inorganic film, the second inorganic film is a processing aid film for the first inorganic film, the third inorganic film is a light-shielding film, and the fourth inorganic film is a phase shift film.

In the other aspect, the invention provides a photomask blank including a transparent substrate, a first inorganic film which contains silicon and is free of chromium, and a second inorganic film which contains chromium and is free of silicon, the first inorganic film and the second inorganic film being contacted, the first inorganic film being formed on the substrate directly or via one or more another inorganic films, wherein when fluorine-based dry etching is performed under the same condition, a ratio of an etching rate of the second inorganic film to an etching rate of the first inorganic film is not less than 0.3.

Preferably, the second inorganic film has a chromium content of not less than 25 at % and not more than 40 at %.

Preferably, the second inorganic film has a thickness of not less than 1 nm and not more than 10 nm.

Preferably, the photomask blank includes a third inorganic film which contains chromium and is free of silicon, as said other film, and the third inorganic film is in contact with the transparent substrate side of the first inorganic film.

Preferably, when fluorine-based dry etching is performed under the same condition, a ratio of an etching rate of the third inorganic film to an etching rate of the first inorganic film is less than 0.3.

Preferably, the photomask blank includes a fourth inorganic film which contains is silicon and is free of chromium, as said other film, and the fourth inorganic film is in contact with the substrate side of the third inorganic film.

Preferably, the first inorganic film is a hard mask film for the third inorganic film, the second inorganic film is a processing aid film for the first inorganic film, the third inorganic film is a light-shielding film, and the fourth inorganic film is a phase shift film.

Preferably, the photomask blank includes a resist film being in contact with the side remote form the transparent substrate of the second inorganic film.

Advantageous Effects of the Invention

According to the invention, adhesion of a resist film is ensured regardless of properties of a film containing silicon by forming the re resist film via a second inorganic film containing chromium and being free of silicon to a first inorganic film containing silicon and being free of chromium. Moreover, by forming the second inorganic film containing chromium and being free of silicon, as a film that can be etched by fluorine-based dry etching, and patterning both of the second inorganic film and the first inorganic film by fluorine-based dry etching in this order, a photomask in which defects are reduced can be manufactured with avoiding problem of resist residues generated after development when forming a resist pattern from a resist film, which is a problem in the silylation treatment of a film containing silicon, and without adding further processing steps. Further, according to the invention, regarding the film properties (composition, physical properties, and the like) of the first inorganic film, which is a film containing silicon, since it is not required to consider adhesion to the resist film, the first inorganic film can be selected with high degree of freedom.

DESCRIPTION OF THE PREFERRED EMBODIMENT

A photomask blank of the invention includes a transparent substrate, a first inorganic film which contains silicon and is free of chromium, a second inorganic film which contains chromium and is free of silicon, and the first inorganic film and the second inorganic film is contacted. The transparent substrate is not particularly limited as long as it is a material that is transparent to exposure light and has a small deformation due to heat treatment in a manufacture of a photomask blank and a photomask. A quartz substrate is exemplified as such a transparent substrate. The first inorganic film may be formed on the substrate directly or via one or more another inorganic films (for example, a third inorganic film, a fourth inorganic film, or the like), however, the first inorganic film is preferably formed via said other inorganic film on the transparent substrate. Further, a resist film may be formed on the side remote from the substrate of the second inorganic film.

Figure 1:
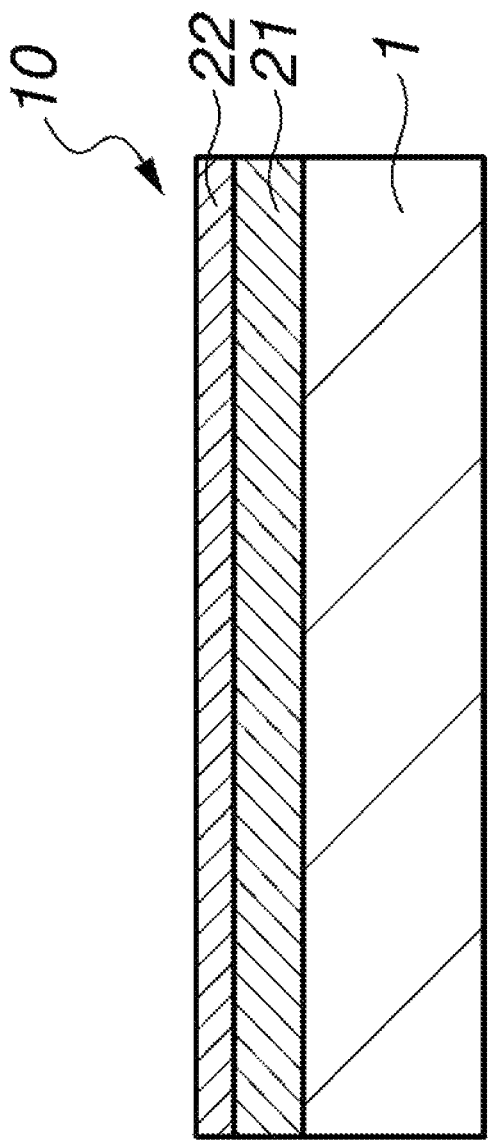
FIG. 1 is a cross-sectional view showing an example of a photomask blank of the invention.
Figure 2:
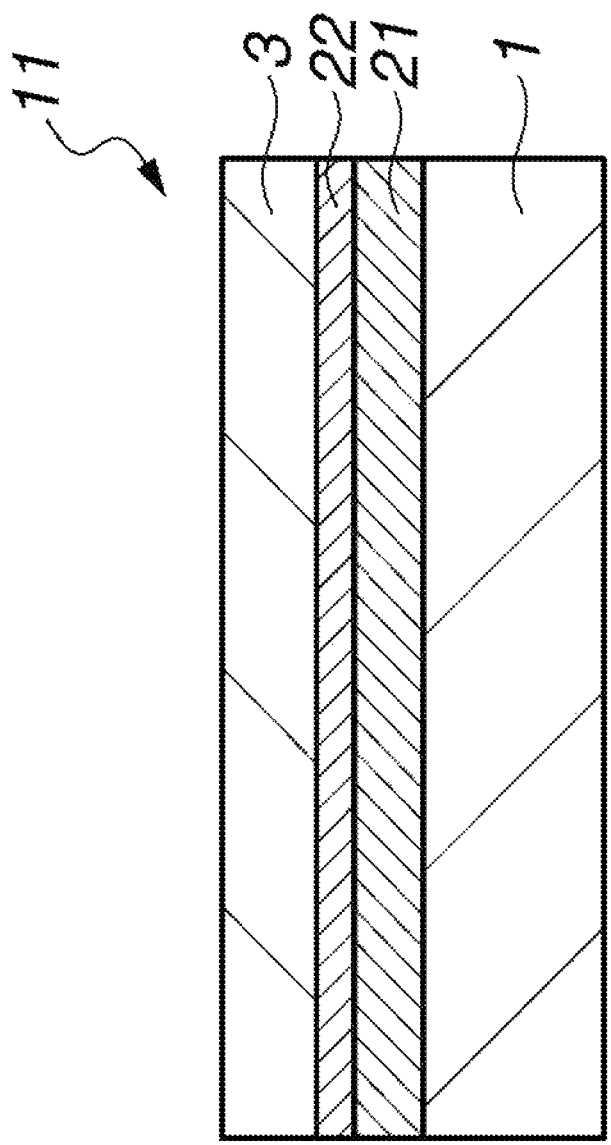
FIG. 2 is a cross-sectional view showing another example of a photomask blank of the invention.

FIG. 1 is a cross-sectional view showing an example of a photomask blank of the invention. In the photomask blank 10, a first inorganic film 21 is formed in contact with a transparent substrate 1, and a second inorganic film 22 is formed in contact with the first inorganic film 21, in this order. FIG. 2 is a cross-sectional view showing another example of a photomask blank of the invention. In the photomask blank 11, a first inorganic film 21 is formed in contact with a transparent substrate 1, a second inorganic film 22 is formed in contact with the first inorganic film 21, and a resist film 3 is formed in contact with the second inorganic film 22, in this order.

The first inorganic film is a film patterned by using a pattern of the second inorganic film, as an etching mask. The first inorganic film contains silicon and is free of chromium, and is preferably composed of a material that is resistant to chlorine-based dry etching and can be removed by fluorine-based dry etching. The first inorganic film may contain a transition metal excluding chromium along with silicon. In the invention, typical examples of the chlorine-based dry etchings include dry etching by an etching gas containing chlorine and oxygen, such as a mixed gas of $Cl_2$ gas and $O_2$ gas, and typical examples of the fluorine-based dry etchings include dry etching by an etching gas containing fluorine such as $CF_4$ gas and $SF_6$ gas.

A material constituting the first inorganic film is preferably a material which contains silicon and is free of a transition metal, or a material which contains silicon, and a transition metal (Me) excluding chromium, and is free of chromium. The material of the film which contains silicon and is free of a transition metal may be silicon simple substance (Si), or a silicon compound containing silicon (Si), and one or more elements selected from the group consisting of oxygen (O), nitrogen (N) and carbon (C). Examples of the materials include a material composed of silicon (Si), a material composed of silicon and oxygen (SiO), a material composed of silicon and nitrogen (SiN), a material composed of silicon, oxygen and nitrogen (SiON), a material composed of silicon and carbon (SiC), a material composed of silicon, oxygen and carbon (SiOC), a material composed of silicon, nitrogen and carbon (SiNC), a material composed of silicon, oxygen, nitrogen and carbon (SiONC), and the like.

On the other hand, the material of the film which contains silicon, and a transition metal (Me) excluding chromium, and is free of chromium may be a transition metal (Me) silicide. or a transition metal (Me) silicon compound containing a transition metal (Me), silicon (Si), and one or more elements selected from the group consisting of oxygen (O), nitrogen (N) and carbon (C). Examples of the materials include a material composed of a transition metal and silicon (MeSi), a material composed of a transition metal, silicon and oxygen (MeSiO), a material composed of a transition metal, silicon and nitrogen (MeSiN), a material composed of a transition metal, silicon, oxygen and nitrogen (MeSiON), a material consisting of transition metal, silicon and carbon (MeSiC), a material composed of a transition metal, silicon, oxygen and carbon (MeSiOC), a material composed of a transition metal, silicon, nitrogen and carbon (MeSiNC)), a material composed of a transition metal, silicon, oxygen, nitrogen and carbon (MeSiONC), and the like.

As the transition metal (Me) excluding chromium, at least one transition metal selected from molybdenum (Mo), tungsten (W), tantalum (Ta), titanium (Ti), zirconium (Zr) and hafnium (Hf) are preferable, however, molybdenum (Mo) is more preferable in the point of view of dry etching processability. In addition, the material constituting the first inorganic film may contain hydrogen, or the like.

Examples of the first inorganic films include an optical film such as a light-shielding film, an antireflection film, and a phase shift film (ex. a halftone phase shift film), and a hard mask film used for an etching mask for the substrate or a third inorganic film described below.

The first inorganic film preferably has a thickness of not less than 1 nm and not more than 100 nm. When the first inorganic film is a light-shielding film, an antireflection film or a phase shift film, the thickness of the first inorganic film is preferably set so that the whole of the films remaining as a light-shielding pattern in the resulting photomask has an optical density (OD) of preferably not less than 2.5, more preferably not less than 3 with respect to exposed light, for example, light having a wavelength of not more than 250 nm, particularly ArF excimer laser (wavelength of 193 nm) or $F_2$ laser (wavelength of 157 nm). In particular, the thickness is preferably not less than 40 nm and not more than 100 nm. When the first inorganic film is a hard mask film, the thickness is preferably not less than 1 nm, more preferably not less than 2 nm, and preferably not more than 30 nm, more preferably not more than 20 nm, even more preferably not more than 10 nm.

The second inorganic film of the invention which contains chromium and is free of silicon is a film that can be etched by fluorine-based dry etching. The fluorine-based dry etching is normally applied to patterning of a film which contains silicon, typically, a film contains silicon and is free of chromium in the manufacturing of a photomask from a photomask blank. By forming the second inorganic film as a film that can be etched by fluorine-based dry etching, the second inorganic film can be etched by fluorine-based dry etching that is applied to the first inorganic film, particularly in the same etching step that is applied to the first inorganic film. In particular, when fluorine-based dry etching is performed under the same condition, the second inorganic film that can be etched by fluorine-based dry etching has a ratio of an etching rate of the second inorganic film to an etching rate of the first inorganic film, and has the ratio of preferably not less than 0.1, more preferably not less than 0.3.

The second inorganic film can be said to be a processing aid film for the first inorganic film. The second inorganic film has a thickness of preferably not less than 1 nm, more preferably not less than 2 nm, and preferably not more than 10 nm, more preferably not more than 5 nm, in the point of view of a processing aid film. The second inorganic film having a thickness within the above range is preferable because the second inorganic film that has the thickness is possible to be patterned without increasing a thickness of a resist film. Further, a material constituting the second inorganic film is preferably a chromium compound in the point of view of efficient patterning of the film by fluorine-based dray etching. The chromium compound may contain chromium (Cr), and at least one element selected from the group consisting of oxygen (O), nitrogen (N) and carbon (C). Examples of the chromium compounds includes a material composed of chromium and oxygen (CrO), a material composed of chromium and nitrogen (CrN), a material composed of chromium, oxygen and nitrogen (CrON), a material composed of chromium and carbon (CrC), a material composed of chromium and oxygen and carbon (CrOC), a material composed of chromium, nitrogen and carbon (CrNC), a material composed of chromium, oxygen, nitrogen and carbon (CrONC), and the like.

In the chromium compound for the second inorganic film, a chromium content is preferably not less than 25 at %, more preferably not less than 30 at %, and preferably less than 40 at %, more preferably not more than 39 at %. Further, an oxygen content is preferably 0 at % or more, more preferably not less than 10 at %, and preferably not more than 70 at %, more preferably not more than 65 at %; a nitrogen content is preferably 0 at % or more, more preferably not less than 5 at %, and preferably not more than 60 at %, more preferably not more than 50 at %; and a carbon content is preferably 0 at % or more, more preferably not less than 1 at %, and preferably not more than 30 at %, more preferably not more than 20 at %.

The second inorganic film preferably has a sheet resistance of not less than $1 \times 10^4 \Omega/\square$. When the first inorganic film is a film having high resistance such as $SiO_2$ (for example, a film having a sheet resistance not less than $1 \times 10^{12} \Omega/\square$), the second inorganic film can be functioned as a conductive film by reducing the sheet resistance of the second inorganic film.

As a photomask blank in which the first inorganic film is formed via one or more other inorganic films on the transparent substrate, a photomask blank including a third inorganic film which contains chromium and is free of silicon, and which is in contact with the transparent substrate side of the first inorganic film is exemplified. By such a photomask blank, the third inorganic film functions as a hard mask having resistance to fluorine-based dry etching to the first inorganic film, and the third inorganic film can be selectively removed from the first inorganic film.

Further, as a photomask blank in which the first inorganic film is formed via one or more other inorganic films on the transparent substrate, a photomask blank including a fourth inorganic film which contains silicon and is free of chromium along with the third inorganic film, and which is in contact with the transparent substrate side of the third inorganic film is exemplified. Also in the cases that the a photomask blank includes said the other film, a resist film may be formed the side remote from the transparent substrate of the second inorganic film.

Figure 3:
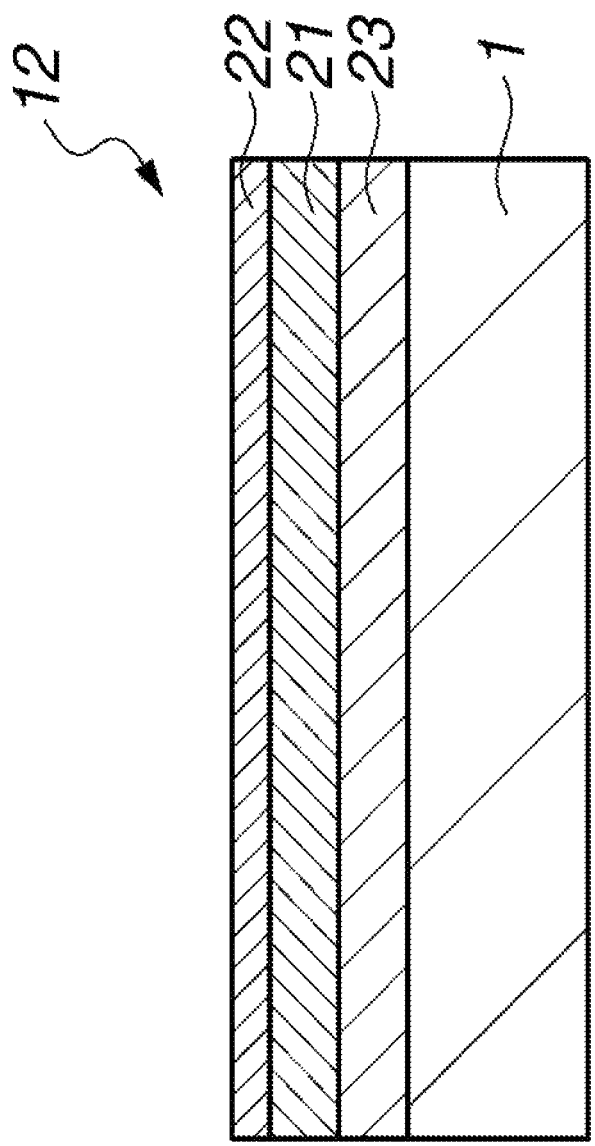
FIG. 3 is a cross-sectional view showing an example of a photomask blank including a third inorganic film of the invention.
Figure 4:
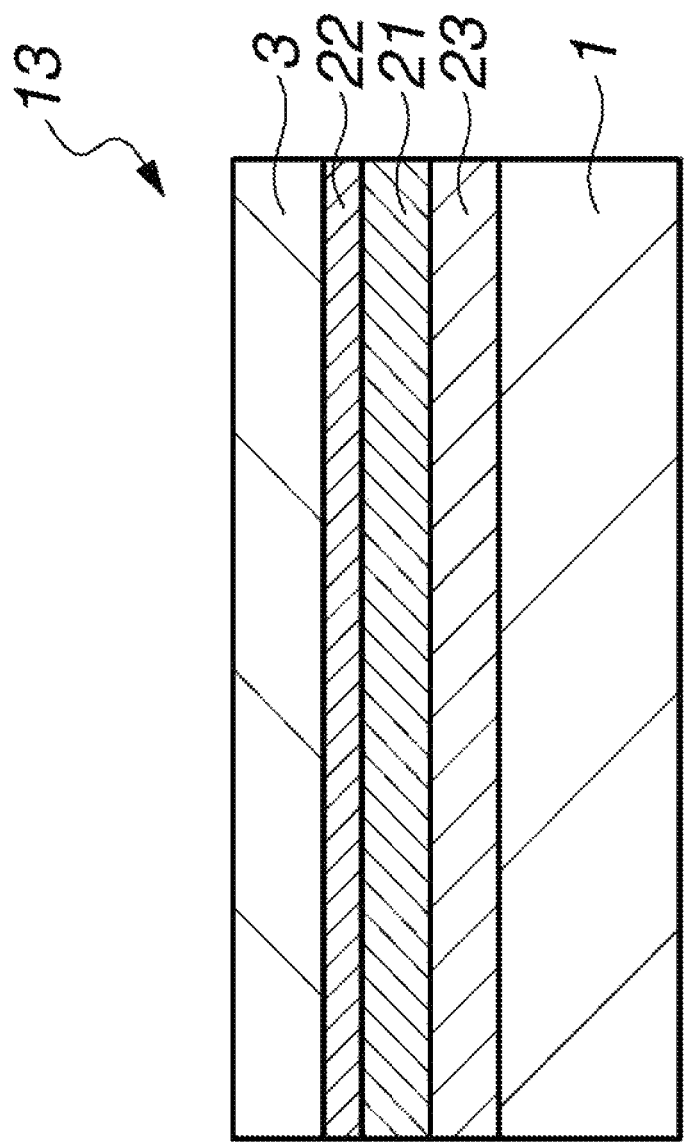
FIG. 4 is a cross-sectional view showing another example of a photomask blank including a third inorganic film of the invention.

FIG. 3 is a cross-sectional view showing an example of a photomask blank including a third inorganic film of the invention. In the photomask blank 12, a third inorganic film 23 is formed in contact with a transparent substrate 1, a first inorganic film 21 is formed in contact with third inorganic film 23, and a second inorganic film 22 is formed in contact with the first inorganic film 21, in this order. FIG. 4 is a cross-sectional view showing another example of a photomask blank including a third inorganic film of the invention. In the photomask blank 13, a third inorganic film 23 is formed in contact with a transparent substrate 1, a first inorganic film 21 is formed in contact with third inorganic film 23, a second inorganic film 22 is formed in contact with the first inorganic film 21, and a resist film 3 is formed in contact with the second inorganic film 22.

Figure 5:
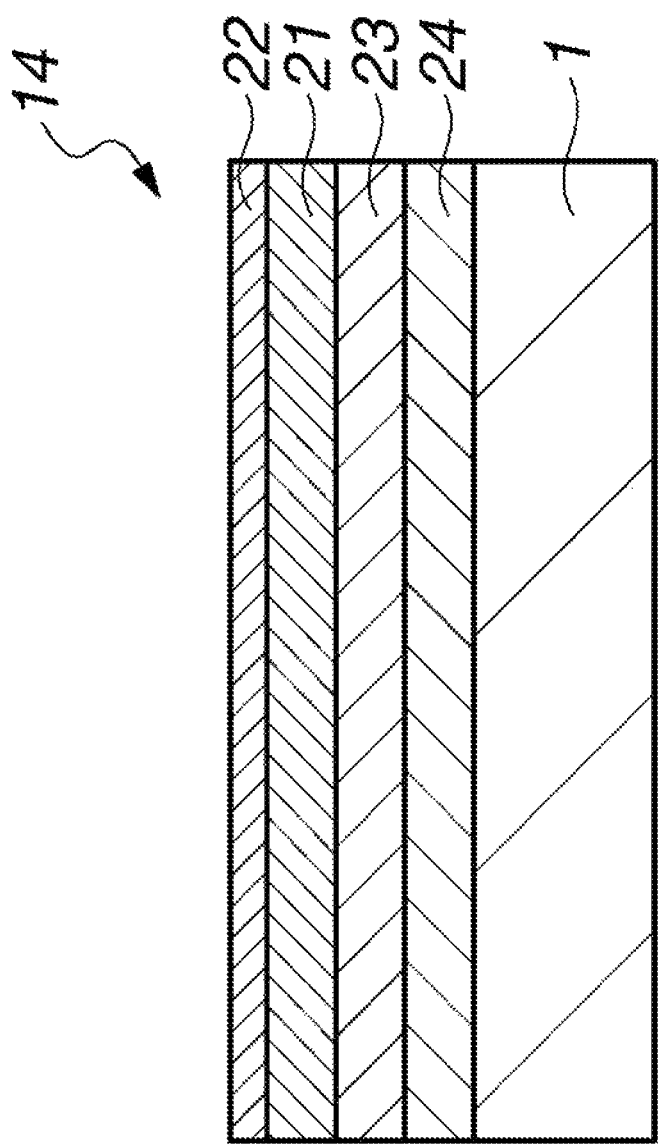
FIG. 5 is a cross-sectional view showing an example of a photomask blank including a third inorganic film and a fourth inorganic film of the invention.
Figure 6:
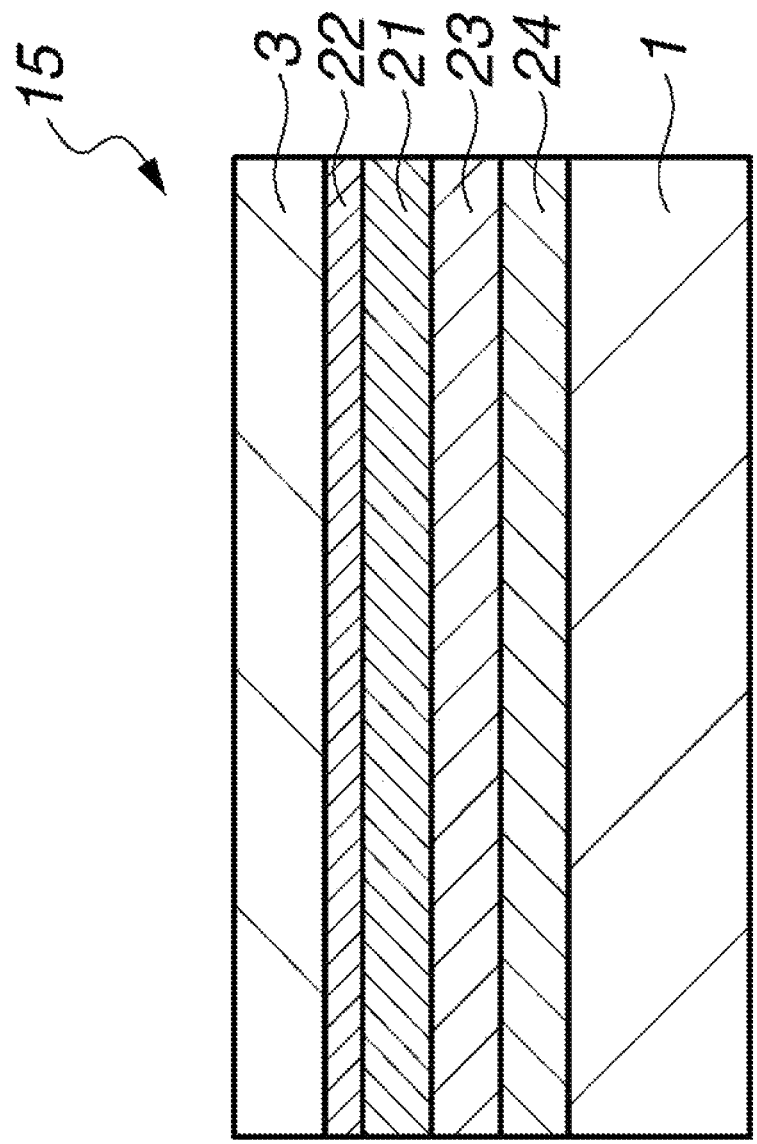
FIG. 6 is a cross-sectional view showing another example of a photomask blank including a third inorganic film and a fourth inorganic film of the invention.

FIG. 5 is a cross-sectional view showing an example of a photomask blank including a third inorganic film and a fourth inorganic film of the invention. In the photomask blank 14, a fourth inorganic film 24 is formed in contact with a transparent substrate 1, a third inorganic film 23 is formed in contact with the fourth inorganic film 24, a first inorganic film 21 is formed in contact with third inorganic film 23, and a second inorganic film 22 is formed in contact with the first inorganic film 21, in this order. FIG. 6 is a cross-sectional view showing another example of a photomask blank including a third inorganic film and a fourth inorganic film of the invention. In the photomask blank 15, a fourth inorganic film 24 is formed in contact with a transparent substrate 1, a third inorganic film 23 is formed in contact with the fourth inorganic film 24, a first inorganic film 21 is formed in contact with third inorganic film 23, a second inorganic film 22 is formed in contact with the first inorganic film 21, and a resist film 3 is formed in contact with the second inorganic film 22, in this order.

In the invention, the third inorganic film which contains chromium and is free of silicon may be a film that can be removed by fluorine-based dry etching. The third inorganic film preferably has etching properties different from that of the first inorganic film, or high etching selectivity to the first inorganic film. The third inorganic film is more preferable a film that is not etched by fluorine-based dry etching. In particular, when fluorine-based dry etching is performed under the same condition, the third inorganic film that is no etched by fluorine-based dry etching has a ratio of an etching rate of the third inorganic film to an etching rate of the first inorganic film, and has the ratio of preferably less than 0.3, more preferably not more than 0.1.

A material composed of the third inorganic film which contains chromium and is free of silicon may be chromium simple substance (Cr), or a chromium compound containing chromium (Cr), and one or more elements selected from the group consisting of oxygen (O), nitrogen (N) and carbon (C). Examples of the chromium compounds include a material composed of chromium and oxygen (CrO), a material composed of chromium and nitrogen (CrN), a material composed of chromium, oxygen and nitrogen (CrON), a material composed of chromium and carbon (CrC), a material composed of chromium and oxygen and carbon (CrOC), a material composed of chromium, nitrogen and carbon (CrNC), and a material composed of chromium, oxygen, nitrogen and carbon (CrONC), and the like.

In the chromium compound for the third inorganic film, a chromium content is preferably not less than 30 at %, more preferably not less than 35 at %, and preferably 100% or less, more preferably not more than 80 at %. Further, an oxygen content is preferably 0 at % or more, more preferably not less than 5 at %, and preferably not more than 70 at %, more preferably not more than 60 at %; a nitrogen content is preferably 0 at % or more, more preferably not less than 10 at %, and preferably not more than 60 at %, more preferably not more than 50 at %; and a carbon content is preferably 0 at % or more, more preferably not less than 1 at %, and preferably not more than 40 at %, more preferably not more than 30 at %.

Examples of the third inorganic films include an optical film such as a light-shielding film, an antireflection film, a phase shift film (ex. a halftone phase shift film), an etching stopper film for the first inorganic film, and a hard mask film used as an etching mask film for the transparent substrate or the fourth inorganic film. When the third inorganic film is included in the photomask blank, for example, the third inorganic film may be a light-shielding film, and the first inorganic film may be an antireflection film.

The third inorganic film preferably has a thickness of not less than 1 nm and not more than 100 nm. When the third inorganic film is alight-shielding film, an antireflection film or a phase shift film, the thickness of the third inorganic film is preferably set so that the whole of the films remaining as a light-shielding pattern in the resulting photomask has an optical density (OD) of preferably not less than 2.5, more preferably not less than 3 with respect to exposed light, for example, light having a wavelength of not more than 250 nm, particularly ArF excimer laser (wavelength of 193 nm) or $F_2$ laser (wavelength of 157 nm). In particular, the thickness is preferably not less than 40 nm and not more than 100 nm. When the third inorganic film is an etching stopper film or a hard mask film, the thickness is preferably not less than 1 nm, more preferably not less than 2 nm, and preferably not more than 30 nm, more preferably not more than 20 nm, even more preferably not more than 10 nm.

In the invention, the fourth inorganic film which contains silicon and is free of chromium preferably has etching properties different from that of the third inorganic film, or high etching selectivity to the third inorganic film. The fourth inorganic film is preferably composed of a material that is resistant to chlorine-based dry etching and can be removed by fluorine-based dry etching. The fourth inorganic film may contain a transition metal excluding chromium along with silicon.

A material constituting the fourth inorganic film is preferably a material which contains silicon and is free of a transition metal, or a material which contains silicon, and a transition metal (Me) excluding chromium, and is free of chromium. The material of the film which contains silicon and is free of a transition metal may be silicon simple substance (Si), or a silicon compound containing silicon (Si), and one or more elements selected from the group consisting of oxygen (O), nitrogen (N) and carbon (C), or the materials exemplified for the first inorganic film. Further, the material of the film which contains silicon, and a transition metal (Me) excluding chromium, and is free of chromium may be a transition metal (Me) silicide containing a transition metal (Me) and silicon (Si), a transition metal (Me) silicon compound containing a transition metal (Me), silicon (Si), and one or more elements selected from the group consisting of oxygen (O), nitrogen (N) and carbon (C), or the materials exemplified for the first inorganic film. Examples of the transition metals (Me) excluding chromium include transition metals (Me) exemplified for the first inorganic film, however, molybdenum (Mo) is more preferable in the point of view of dry etching processability. In addition, the material constituting the fourth inorganic film may contain hydrogen, or the like.

Examples of the fourth inorganic films include an optical film such as a light-shielding film, an antireflection film, a phase shift film (ex. a halftone phase shift film), and an etching stopper film for the third inorganic film.

The fourth inorganic film preferably has a thickness of not less than 1 nm and not more than 100 nm. When the fourth inorganic film is alight-shielding film, an antireflection film or a phase shift film, the thickness of the fourth inorganic film is preferably set so that the whole of the films remaining as a light-shielding pattern in the resulting photomask has an optical density (OD) of preferably not less than 2.5, more preferably not less than 3 with respect to exposed light, for example, light having a wavelength of not more than 250 nm, particularly ArF excimer laser (wavelength of 193 nm) or $F_2$ laser (wavelength of 157 nm). In particular, the thickness is preferably not less than 40 nm and not more than 100 nm.

Each of the first inorganic film, the second inorganic film, and said other films (the first inorganic film, the second inorganic film, or the like) may consist of single layer or a plurality of layers (two or more, usually four or less), and may by a film having graded composition. In the cases of a plurality of layers, for example, the transparent substrate side may be formed by a layer formed by a material having a high content of oxygen and/or nitrogen to improve adhesion, or an antireflection layer (layer (A)), and the side remote from the transparent substrate may be formed by an antireflection layer (layer (B)). In particular, a plurality of layers may be a light-shielding film having a two-layered structure consisting of, from the transparent substrate side, the layer (A) and a light-shielding layer, or a light-shielding film having a two-layered structure consisting of, from the transparent substrate side, a light-shielding layer and the layer (B), or a light-shielding film having a three-layered structure consisting of, from the transparent substrate side, the layer (A), a light-shielding layer and a layer (B).

In the photomask blank of the invention, an organic film such as a resist film may be formed in contact with the side remote from the transparent substrate of the second inorganic film. The resist film may be an electron beam resist drawn with an electron beam or a photoresist drawn with light, and a chemically amplified resist is preferable. The chemically amplified resist may be a positive type resist or a negative type resist. The chemically amplified resist contains, for example, a hydroxystyrene resin or a (meth)acrylic acid resin, and an acid generator, and optionally added a cross-linking agent, a quencher, a surfactant, or the like. A thickness of the resist film can be appropriately set so as to obtain a photomask pattern having a good shape. The thickness is preferably not less than 50 nm, more preferably not less than 70 nm, and preferably not more than 200 nm, more preferably not more than 150 nm.

The photomask blank of the invention may be a binary mask blank, or a phase shift mask blank such as a halftone phase shift mask blank. From these, a binary mask, and a phase shift mask such as a halftone phase shift mask are manufactured, respectively.

A preferable combination of the inorganic films on the transparent substrate is, for example, a combination of a first inorganic film as a hard mask film for a third inorganic film, a second inorganic film as a processing aid film for a first inorganic film, a third inorganic film as a light-shielding film, and a fourth inorganic film as a phase shift film. When the first inorganic film is a hard mask film for the third inorganic film, it is possible to improve transferability of pattern with sufficiently ensured processing accuracy of the first inorganic film as a hard mask film. In particular, as a photomask blank for forming a fine pattern, for example, as a photomask blank for forming a photomask pattern finer than nm node, the first inorganic film as a hard mask film for the third inorganic film, and the second inorganic film as a processing aid film for the first inorganic film are especially effective for forming a photomask pattern with high accuracy. When the first inorganic film is a hard mask film, a material composed of silicon and oxygen (SiO) or a material composed of silicon, oxygen and nitrogen (SiON) is preferable as a material constituting the first inorganic film in view of high etching resistance.

A method of forming of the inorganic film used for the photomask blank of the invention is not particularly limited. For example, when forming a film of a material composed of silicon and oxygen such as $SiO_2$ or the like, it may be formed by CVD using a gas containing silicon, for example, monosilane, dichlorosilane, trichlorosilane, or the like. However, it is preferable to form by sputtering method because it has good controllability and easily forms a film having predetermined properties. As the sputtering method, DC sputtering, or RF sputtering can be applied, however not limited thereto.

A silicon target may be used for forming the film containing silicon and being free of transition metals, for the first inorganic film, the fourth inorganic film, or the like, as a sputter target. Further, a target of transition metal (Me) excluding chromium, and a silicon target may be used for forming the film containing silicon and a transition metal (Me) excluding chromium, and being free of chromium, for the first inorganic film, the fourth inorganic film, or the like, as a sputter target. In this case, co-sputtering may also be performed by using a silicon target and a target of a transition metal (Me) excluding chromium; a plurality of targets containing silicon and a transition metal (Me) excluding chromium, and having different compositions each other (targets in which some or all of the constituent elements are different, or targets in which the constituent elements are the same but concentrations are different); or a silicon target or a target of a transition metal (Me) excluding chromium, and a target containing silicon and a transition metal (Me) excluding chromium. On the other hand, a chromium target may be used for forming the film containing chromium and being free of silicon, for the second inorganic film, the third inorganic film, or the like, as a sputter target.

A power applied across the sputter target is adjusted in consideration of target size, cooling efficiency, controllability of formation of the film, or the like. Typically, the power is 0.1 to 10 $W/cm^2$ with respect to unit area of the sputter area of the sputter target.

When forming a film of a material composed of only silicon, a material composed of only silicon and a transition metal, or a material composed of only chromium, as a sputter gas, only a rare gas such as helium gas (He), neon gas (Ne), and argon gas (Ar) is used. On the other hand, when forming a film of a material containing oxygen, nitrogen or carbon, the sputtering is preferably reactive sputtering. As a sputter gas, a rare gas such as helium gas (He), neon gas (Ne), and argon gas (Ar), and a reactive gas are used. For example, when forming a film of a material containing oxygen, oxygen gas ($O_2$ gas) may be used as the reactive gas. When forming a film of a material containing nitrogen, nitrogen gas ($N_2$ gas) may be used as the reactive gas. Further, when forming a film of a material containing both nitrogen and oxygen, as the reactive gas, oxygen gas ($O_2$ gas) and nitrogen gas ($N_2$ gas) may be used at the same time, or nitrogen oxide gas such as nitrogen monoxide gas (NO gas) and nitrogen dioxide gas ($NO_2$ gas) may be used. When forming a film of a material containing carbon, a gas containing carbon such as methane gas ($CH_4$), carbon monoxide gas (CO gas) and carbon dioxide gas ($CO_2$ gas) may be used as the reactive gas.

A pressure for film formation may be appropriately set in consideration of film stress, chemical resistance, cleaning resistance, or the like. Chemical resistance can be improved by adjusting the pressure within normally not less than 0.01 Pa, particularly not less than 0.03 Pa, and normally not more than 1 Pa, particularly not more than 0.3 Pa. Further, each gas flow rate may be appropriately set so as to obtain a desired composition, and is normally 0.1 to 100 sccm.

In the process of manufacturing the photomask blank, heat treatment may be performed to the transparent substrate or the transparent substrate and the inorganic film. As a method of the heat treatment, infrared heating, resistance heating, or the like can be applied, and treatment conditions are not particularly limited. The heat treatment may be carried out, for example, under atmosphere of gas containing oxygen. The concentration of the gas containing oxygen is, for example, 1 to 100% by volume in case of oxygen gas ($O_2$ gas), however, not limited thereto. A temperature of the heat treatment is preferably not less than 200° C., more preferably not less than 400° C. Further, in the manufacturing process of the photomask blank, the inorganic film may be subjected to ozone treatment, plasma treatment, or the like, and conditions for the treatment are not particularly limited. Each treatment may be performed for the purpose of increasing oxygen concentration on the surface portion of the inorganic film, and in each case, conditions of the treatment may be appropriately adjusted so as to obtain a predetermined oxygen concentration. In addition, when the inorganic film is formed by sputtering, it is also possible to increase the oxygen concentration on the surface portion of the inorganic film by adjusting a ratio of a gas containing oxygen (an oxidizing gas) such as oxygen gas ($O_2$ gas), carbon monoxide gas (CO gas), and carbon dioxide gas (CO2 gas), to a rare gas, in the sputter gas.

In the process of manufacturing the photomask blank, cleaning treatment may be performed in order to remove particles existing on the surface of the transparent substrate or the inorganic film. The cleaning can be performed by using one or both of ultrapure water, and a functional water which is ultrapure water containing ozone gas, hydrogen gas or the like. Further, after washing with ultrapure water containing a surfactant, the cleaning may be performed by using one or both of ultrapure water and a functional water. The cleaning may be performed while irradiating ultrasonic, if needed, and further, can be combined with UV light irradiation.

When the photomask of the invention is included a resist film, a method for applying the resist film is not particularly limited, and a commonly known method may be applied.

A photomask can be manufactured from the photomask of the invention. The photomask can be manufactured by, for example, the method including the following steps. First, in case of the photomask in which a resist film is not formed in the photomask blank, a resist film is formed in contact with the second inorganic film (Step (A)). Next, the resist film is patterned to form a resist pattern (Step (B)). Next, the second inorganic film is etched by fluorine-based dry etching with using the resist pattern as an etching to form a pattern of formed mask (Step (C)). Next, the first inorganic film is etched by fluorine-based dry etching with using the pattern of the second inorganic film as an etching mask to form a pattern of the first inorganic film (Step (D)). When the photomask blank has no other inorganic films (the third inorganic film, the fourth inorganic film, and the like) between the transparent substrate and the first inorganic film, further, if necessary, the remaining resist pattern and the pattern of the second inorganic film may be removed, obtaining the photomask.

The dry etching for the second inorganic film which contain chromium and is free of silicon in Step (C) is performed by not chlorine-based dry etching that is normally applied to a film which contains chromium and is free of silicon in manufacturing a photomask from a photomask blank, but fluorine-based dry etching. Accordingly, both dry etchings in Step (C) and Step (D) are performed by fluorine-based dry etching, therefore, may be continuously performed. To perform the fluorine-based dry etching in step (C) and Step (D), it is effective that a ratio of an etching rate of the second inorganic film by the fluorine-based dry etching applied in step (C) to an etching rate of the first inorganic film by the fluorine-based dry etching applied in step (D) is not less than 0.1, preferably not less than 0.3. The fluorine-based dry etching in step (C) and the fluorine-based dry etching in step (D) is preferably performed under the same condition.

In the case that the third inorganic film is present between the transparent substrate and the first inorganic film, after Step (D), a pattern of the third inorganic film can be formed in accordance with the etching properties of the third inorganic film by using chlorine-based dry etching with using the pattern of the first inorganic film as an etching mask. In the case that no other films (ex. the fourth inorganic film) are present between the transparent substrate and the third inorganic film, the photomask may be obtained by optionally removing the remaining resist pattern and the pattern of the second inorganic film appropriately, further optionally removing the pattern of the first inorganic film. In this case, a pattern may be formed in the transparent substrate in accordance with the etching properties of the transparent substrate by using fluorine-based dry etching with the pattern of the third inorganic film as an etching mask.

In the case that the third inorganic film and the fourth inorganic film are present between the transparent substrate and the first inorganic film, after Step (D), a pattern of the third inorganic film can be formed in accordance with the etching properties of the third inorganic film by using chlorine-based dry etching with the pattern of the first inorganic film as an etching mask. Further, a pattern of the fourth inorganic film can be formed in accordance with the etching properties of the fourth inorganic film by using fluorine-based dry etching with the pattern of the third inorganic film as an etching mask. Then, the photomask may be obtained by optionally removing the remaining resist pattern and the pattern of the second inorganic film appropriately, further optionally removing the pattern of the first inorganic film. In this case, if needed, a new resist pattern may be formed, and a part or all of the pattern of the third inorganic film may be removed by chlorine-based dry etching.

In view point of etching selectivity of the third inorganic film to the first inorganic film, a ratio of an etching rate of the third inorganic film by the fluorine-based dry etching applied in step (D) to an etching rate of the first inorganic film by the fluorine-based dry etching applied in step (D) is preferably less than 0.3, more preferably not more than 0.1.

In a photolithographic method for forming a pattern with a half pitch of not more than 50 nm, preferably not more than 30 nm, and more preferably not more than 20 nm, even more preferably not more than 10 nm on a substrate to be processed, the photomask of the invention is best suited for use in exposure including the steps of forming a photoresist film on the substrate to be processed, and exposing the photoresist film by light of wavelength not more than 250 nm, especially not more than 200 nm, typically ArF excimer laser (wavelength of 193 nm) or $F_2$ laser (wavelength of 157 nm), through the photomask for transferring the pattern to the photoresist film.

The photomask obtained from the photomask blank may be applied to the pattern forming process including irradiating exposure light to the photomask pattern for transferring the photomask pattern to an object to be exposed (a photoresist film) on the substrate to be processed. The irradiation of exposure light may be either dry exposure or immersion exposure. The photomask of the invention is effective particularly when a photomask pattern is exposed by the immersion lithography for a wafer of not less than 300 mm as the substrate to be processed.

EXAMPLE

Examples are given below for further illustrating the invention although the invention is not limited thereto.

Example 1

A MoSiON film (thickness of 75 nm) was formed as a phase shift film (a fourth inorganic film) by sputtering on a quartz substrate having dimensions of 152 mm-square and about 6 mm-thick. The sputtering was performed by using argon gas, oxygen gas and nitrogen gas, as sputter gases, and using two kinds of targets, a $MoSi_2$ target and a Si target, as sputter targets, while rotating the quartz substrate at 30 rpm. The composition of the phase shift film was measured by ESCA (Electron Spectroscopy for Chemical Analysis) method (XPS method) using K-Alpha (manufactured by Thermo Fisher Scientific K.K.). The same applied to the ESCA method below. The film had a composition of Mo:Si:O:N=1:4:1:4 in atomic ratio.

Next, from the quartz substrate side, a CrN layer (thickness of 30 nm) and a CrON layer (thickness of 20 nm) was formed as a light-shielding film (a third inorganic film) by sputtering on the fourth inorganic film. The sputtering was performed by using argon gas and nitrogen gas for the CrN layer, and argon gas, oxygen gas and nitrogen gas for the CrON layer, as sputter gases, and using a chromium metal target as a target, while rotating the quartz substrate at 30 rpm. The composition of the light-shielding film was measured by ESCA. The CrN layer had a composition of Cr:N=9:1 in atomic ratio, and the CrON layer had a composition of Cr:O:N=4:5:1 in atomic ratio.

Next, a SiO film (thickness of 5 mu) was formed as a hard mask film (a first inorganic film) by sputtering on the third inorganic film. The sputtering was performed by using argon gas and oxygen gas, as sputter gases, and using a Si target as a target, while rotating the quartz substrate at 30 rpm. The composition of the hard mask film was measured by ESCA. The film had a composition of Si:O=1:2 in atomic ratio.

Next, a CrON film (thickness of 5 nm) was formed as a processing aid film (a second inorganic film) by sputtering on the first inorganic film. The sputtering was performed by using argon gas, oxygen gas and nitrogen gas, as sputter gases, and using a chromium metal target as a target, while rotating the quartz substrate at 30 rpm. The composition of the processing aid film was measured by ESCA. The film had a composition of Cr:O:N=37:51:12 in atomic ratio.

Next, a negative type electron beam resist (manufactured by Shin-Etsu Chemical Co., Ltd.) was applied on the second inorganic film to form a resist film (thickness of 100 nm), obtaining a photomask blank (phase shift mask blank).

The resist film of the photomask blank obtained by the same method was developed with tetramethylammonium hydroxide, and rinsed with pure water. Defects were inspected by an inspection device (MAGICS 2350, manufactured by Lasertec Corporation). The detected defects which have a size of 0.1 μm or more were not more than 50, and the defects were limited.

Next, a pattern was drawn on the resist film of the photomask blank obtained by the same method by an electron beam (EB) and developed by tetramethylammonium hydroxide to form a resist pattern. Next, using the resist pattern as an etching mask, the second inorganic film and the first inorganic film were etched in this order by fluorine-based dry etching under the following conditions, and a pattern of the second inorganic film and a pattern of the first inorganic film were formed. Next, using the pattern of the first inorganic film as an etching mask, the third inorganic film was etched by chlorine-based dry etching under the following conditions to form a pattern of the third inorganic film. At this stage, the remaining resist pattern was removed.

Next, using the pattern of the third inorganic film as an etching mask, the fourth inorganic film was etched by fluorine-based dry etching under the following conditions to form a pattern of the fourth inorganic film with removing the pattern of the second inorganic film and the pattern of the first inorganic film. Next, anew resist film was formed on the quartz substrate and the pattern of the third inorganic film, and a resist pattern was formed so that the resist film remains outside the mask pattern forming area of the photomask. Further, using the resist pattern as an etching mask, the third inorganic film within the mask pattern forming area was etched by chlorine-based dry etching under the following conditions to remove the third inorganic film. Finally, the remaining resist pattern was removed, obtaining a photomask (phase shift mask).

<Fluorine-Based Dry Etching Conditions>
RF1 (high frequency power supply for bias): RIE (reactive ion etching), CW (continuous discharge), 54 W
RF2 (high frequency power supply for antenna): ICP (inductively coupled plasma), CW (continuous discharge), 325 W
Pressure: 5 mTorr (0.67 Pa)
$SF_6$: 18 sccm
$O_2$: 45 sccm <Chlorine-Based Dry Etching Conditions>
RF1 (high frequency power supply for bias): RIE (reactive ion etching), pulse, 700V
RF2 (high frequency power supply for antenna): ICP (inductively coupled plasma), CW (continuous discharge), 400 W
Pressure: 6 mTorr (0.80 Pa)
$Cl_2$: 185 sccm
$O_2$: 55 sccm
He: 9.25 sccm Under the above same fluorine-based dry etching, a ratio of the etching rate of the second inorganic film to the etching rate of the first inorganic film was 0.3, and a ratio of the etching rate of the third inorganic film to the etching rate of the first inorganic film was 0.2.

Comparative Example 1

A photomask blank (phase shift mask blank) was obtained by the same method as in Example 1 except that the second inorganic film was not formed on the first inorganic film, and the resist film was directly formed on the first inorganic film.

The resist film of the photomask blank obtained by the same method was developed with tetramethylammonium hydroxide, and rinsed with pure water. Defects were inspected by an inspection device (MAGICS 2350, manufactured by Lasertec Corporation). Many resist residues were remained. The detected defects which have a size of 0.1 μm or more were not less than 4,500, and the defects were significantly many.

Japanese Patent Application No. 2020-112639 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising a transparent substrate, a first inorganic film which comprises silicon and is free of chromium, and a second inorganic film which comprises chromium and is free of silicon, the first inorganic film and the second inorganic film being in contact, the first inorganic film being formed on the transparent substrate via two or more inorganic films, wherein a ratio of an etching rate of the second inorganic film to an etching rate of the first inorganic film is not less than 0.3 at a fluorine-based dry etching performed under a same condition, wherein
said two or more inorganic films comprise a third inorganic film which comprises chromium and is free of silicon, and a fourth inorganic film which comprises silicon and is free of transition metals, wherein
the second inorganic film has a chromium content of not less than 20 at % and not more than 40 at % and a thickness of not less than 1 nm and not more than 10 nm,
the third inorganic film is in contact with the transparent substrate side of the first inorganic film, and has a chromium content of not less than 35 at % and a thickness of not less than 40 nm and not more than 100 nm, and
the fourth inorganic film is in contact with the transparent substrate side of the third inorganic film.

2. The photomask blank of claim 1, wherein the second inorganic film has a chromium content of not less than 25 at % and not more than 40 at %.

3. The photomask blank of claim 1, wherein a ratio of an etching rate of the third inorganic film to an etching rate of the first inorganic film is less than 0.3 at a fluorine-based dry etching performed under a same condition.

4. The photomask blank of claim 1, wherein the first inorganic film is a hard mask film for the third inorganic film, the second inorganic film is a processing aid film for the first inorganic film, the third inorganic film is a light-shielding film, and the fourth inorganic film is a phase shift film.

5. The photomask blank of claim 1 further comprising a resist film being in contact with the side of the second inorganic film remote from the transparent substrate.

6. The photomask blank of claim 1, wherein the fourth inorganic film is an etching stopper film for the third inorganic film.

7. The photomask blank of claim 1, wherein the first inorganic film is free of transition metals.

8. The photomask blank of claim 1, wherein the third inorganic film has a thickness of not less than 50 nm and not more than 100 nm.

9. The photomask blank of claim 1, wherein the third inorganic film has a chromium content of not less than 40 at %.

\* \* \* \* \*